United States Patent
Teppan et al.

(10) Patent No.: US 10,126,332 B2
(45) Date of Patent: Nov. 13, 2018

(54) CURRENT TRANSDUCER WITH FLUXGATE DETECTOR

(71) Applicant: LEM INTELLECTUAL PROPERTY SA, Fribourg (CH)

(72) Inventors: Wolfram Teppan, Wünnewil (CH); Davide Azzoni, Meyrin (CH)

(73) Assignee: LEM INTELLECTUAL PROPERTY SA, Fribourg (CH)

( * ) Notice: Subject to any disclaimer, the term of this patent is extended or adjusted under 35 U.S.C. 154(b) by 0 days.

(21) Appl. No.: 15/329,648

(22) PCT Filed: Jul. 20, 2015

(86) PCT No.: PCT/EP2015/066572
§ 371 (c)(1),
(2) Date: Jan. 27, 2017

(87) PCT Pub. No.: WO2016/016038
PCT Pub. Date: Feb. 4, 2016

(65) Prior Publication Data
US 2017/0219632 A1    Aug. 3, 2017

(30) Foreign Application Priority Data
Jul. 30, 2014    (EP) .................................... 14179204

(51) Int. Cl.
*G01R 15/18*    (2006.01)
*G01R 33/04*    (2006.01)
(Continued)

(52) U.S. Cl.
CPC ........... *G01R 15/185* (2013.01); *G01R 33/04* (2013.01); *G01R 1/00* (2013.01); *H01L 2221/00* (2013.01); *H02P 1/00* (2013.01)

(58) Field of Classification Search
CPC ......... G01R 1/00; H02P 1/00; H02P 2101/00; H01L 21/00; H01L 2221/00
See application file for complete search history.

(56) References Cited

U.S. PATENT DOCUMENTS 9,547,026 B1 * 1/2017 Chraim ................ G01R 21/002
2008/0205095 A1 * 8/2008 Pinon ................... H02M 3/1584
363/39
(Continued)

FOREIGN PATENT DOCUMENTS

EP        0356248      2/1990
EP        2431751      3/2012
(Continued)

OTHER PUBLICATIONS

International Search Report and Written Opinion issued by the European Patent Office, dated Oct. 28, 2015, for International Application No. PCT/EP2015/066572; 10 pages.

*Primary Examiner* — Jermele M Hollington
*Assistant Examiner* — Temilade Rhodes-Vivour
(74) *Attorney, Agent, or Firm* — Faegre Baker Daniels LLP

(57) ABSTRACT

Electrical current transducer (2) of a closed-loop type for measuring a primary current ($I_P$) flowing in a primary conductor (1), comprising a fluxgate measuring head (7) and an electronic circuit (16) including a microprocessor (18) for digital signal processing. The measuring head includes a secondary coil (6) and a fluxgate detector (4) comprising an excitation coil and a magnetic material core. The electronic circuit comprises an excitation coil drive circuit (14) configured to generate an alternating excitation voltage to supply the excitation coil with an alternating excitation current ($I_{fx}$), the secondary coil (6) connected in a feedback loop (12) of the electronic circuit to the excitation coil drive circuit (14), the electronic circuit further comprising a ripple
(Continued)

compensation circuit (26, 28) configured to compensate for a ripple signal generated by the alternating excitation voltage.

14 Claims, 20 Drawing Sheets

(51) Int. Cl.
 *G01R 1/00* (2006.01)
 *H02P 1/00* (2006.01)

(56) References Cited

U.S. PATENT DOCUMENTS

| | | | |
|---|---|---|---|
| 2013/0241534 A1* | 9/2013 | Schaerrer | G01R 15/185 324/117 H |
| 2014/0184200 A1* | 7/2014 | Milano | G01R 33/072 324/202 |
| 2015/0042325 A1* | 2/2015 | Snoeij | G01R 15/185 324/251 |

FOREIGN PATENT DOCUMENTS

| | | |
|---|---|---|
| GB | 2438057 | 11/2007 |
| WO | WO 2014/069841 | 5/2014 |

* cited by examiner

CURRENT TRANSDUCER WITH FLUXGATE DETECTOR

This application claims priority to PCT application number PCT/EP2015/066572 filed Jul. 20, 2015, which in turn claims priority from EP Patent application number EP 14179204.4 filed Jul. 30, 2014, the subject matter of which are incorporated herein by reference.

The present invention relates to an electric current transducer comprising a fluxgate magnetic field detector for measuring a current flowing in a primary conductor.

One of the most common ways of measuring a current flowing in a primary conductor is by detecting the magnetic field generated by the current. Electrical current transducer modules for current sensing applications may have different configurations depending on various parameters such as the current measurement range, required accuracy, insensitivity to noise, compactness, manufacturing costs, frequency range and others. In current transducers of the open-loop type, a magnetic field detector generates an image of the current to be measured that represents the measurement signal. In current sensors of the closed-loop type the magnetic field detector is connected in a feed-back loop to a secondary coil that generates a compensation current that tends to cancel the magnetic field generated by the primary conductor. Closed-loop current transducers are generally more accurate and can employ more sensitive magnetic field detectors because of the low intensity of the magnetic field being detected in view of the compensation. Among the most sensitive and accurate magnetic field detectors are fluxgate detectors. These detectors comprise a saturable soft magnetic core surrounded by an excitation coil that is connected to an oscillation circuit that generates an alternating electrical signal configure to alternating saturate the soft magnetic core. A magnetic field, for instance the magnetic field generated by the primary current, generates a bias on the alternating signal that can be measured by various means and that is representative of the external magnetic field.

One of most accurate current transducers available, especially for high current applications, is a fluxgate based current transducer with toroidal detector cores as illustrated in FIG. 1a. Such known transducers are able to measure currents that are too large to be measured directly by other conventional current transducers with errors at the ppm level or even below. This is because the toroidal fluxgate detector is able to accurately pick up the compensated magnetic field which is in the order of magnitude of $10^{-6}$ or less than the magnetic field generated by the primary current. However this also leads to the drawback that even small noise signals that are not part of the signal to be measured disturb the measurement. One of these noise signals is generated by the excitation signal needed for the functioning of the fluxgate detector.

Some conventional fluxgate based current transducers allow for a certain level of compensation of this excitation signal so that it is reduced to a small residue in the output signal as well as in the circuit of the current to be measured. This however increases the cost of the transducer.

A known fluxgate measuring head 7 illustrated in FIGS. 1a and 1c of a known fluxgate based current transducer, comprises a magnetic shield 8 surrounding two annular fluxgate detectors 4, 4', each made of an excitation coil 3 wound around a soft magnetic material core 5. A secondary coil 6 is wound around the magnetic shield. The voltage characteristic of the excitation signal of the fluxgate detectors 4, 4' has an almost rectangular profile as illustrated in FIG. 3a. The excitation frequency is either determined by the excitation voltage and the saturation flux of the fluxgate so that it is self-oscillating, or synchronized to an external signal in a relatively small frequency range. One of the fluxgate detectors is often used for compensation of the excitation signal only. The advantage is that the residual ripple present on the primary side and on the secondary side of the transducer, which influences the current to be measured, is relatively low. Disadvantages however include the manufacturing cost for the second fluxgate and the high frequency noise present in primary and secondary circuits which are caused by the harmonics of the almost rectangular excitation voltage with steep edges.

An equivalent circuit of the fluxgate measuring head illustrated in FIGS. 1a and 1c is represented in FIG. 1b, where:

Lh is the main inductance
Rfe are iron loss resistances
Cs is the parasitic capacitance of the winding
Ls is the leakage inductance
Rcu is the resistance of the winding
NS are the number of secondary turns
Nfx are the number of detectors turns
Rm_S is the resistance of the measuring resistor of the secondary circuit
Rm_fx resistance of the measuring resistor of the fluxgate detector Referring to FIGS. 1b and 1c, both fluxgate detectors 4, 4' are connected in series with the secondary main inductance Rcu_fx plus Ls_fx and the whole is connected in parallel with the primary circuit P and secondary circuit S. For the high frequency range, the current which must be measured, coming from the primary conductor, is directly transferred to the secondary circuit by a current transformer effect. For DC and low frequency signals the current passing through the fluxgate detectors allows the secondary circuit to compensate the primary conductor ampere turns in view of the closed-loop system. The fluxgate detectors are generally excited with a square voltage which generates a ripple on the primary side and on the secondary circuit by and electromagnetic coupling due to the steep slopes of the excitation voltage as seen in FIG. 3a. The purpose of the second fluxgate detector is to minimize these undesirable effects.

FIG. 2 represents an equivalent circuit without the second fluxgate detector 4'. The excitation voltage Vfx_in generates a voltage U1 by a transformer effect. This voltage is distributed on circuit portions Z2 and Z3 (the primary circuit P is open) and thus generates a voltage U3 coupled to the secondary circuit S. The result is a noisy current passing through the measuring resistor Rm_fx1 having a fundamental frequency same as the frequency of the excitation voltage. The plots of the FIGS. 3a-3c illustrate this effect.

FIG. 3a shows the excitation voltage Vfx_in and the voltage through the fluxgate measuring resistor Um_fx. FIG. 3b presents a global view of the ripple voltage Um_s across the secondary measuring resistor due to the magnetic coupling between the fluxgate detector circuit and the secondary circuit. The peaks in FIGS. 3b and 3c are mainly due to parasitic coupling during the excitation voltage switching. The peaks can be partially reduced by filtering provided that the bandwidth of the transducer is respected. The low frequency ripple may be reduced by placing a second fluxgate detector 4' into the shield 5 as shown in FIGS. 1a to 1c, and exciting it with the same voltage as the excitation voltage Vfx_in but phase shifted by 180°. Doing this the sum of voltages U1 and U1' should tend to zero, cancelling the effect of the coupling as illustrated in the equivalent circuit of FIG. 1d. In summary, the first fluxgate 4 is used as a detector (master) and the second fluxgate 4' is used to reduce the ripple (slave). Although the second fluxgate detector allows the partial cancellation of the ripple, the peaks are not cancelled. Another drawback of this known system are the high production costs.

The problem of noise resulting from the excitation signal is not limited to the above described specific configuration and may be found in other fluxgate based transducers, especially those used in applications requiring high precision.

An object of the invention is to provide an electrical current transducer with a fluxgate magnetic field detector that is accurate, while being compact and economical to produce and assemble.

It is advantageous to provide an electrical current transducer that is reliable, easy to implement and economical to use.

It is advantageous to provide an electrical current transducer that is robust and stable over its intended lifetime.

Disclosed herein is an electrical current transducer of a closed-loop type for measuring a primary current flowing in a primary conductor, comprising a fluxgate measuring head and an electronic circuit including a microprocessor for digital signal processing. The measuring head includes a secondary coil, and a fluxgate detector comprising an excitation coil and a magnetic material core mounted inside the magnetic shield. The electronic circuit comprises an excitation coil drive circuit configured to generate an alternating excitation voltage to supply the excitation coil with an alternating excitation current. The secondary coil is connected in a feedback loop of the electronic circuit to the excitation coil drive circuit. The electronic circuit further comprises a ripple compensation circuit configured to compensate for a ripple signal generated by the alternating excitation voltage by injecting a ripple compensation signal in a coil of the measuring head.

According to a first aspect of the invention, the ripple compensation circuit comprises a dedicated ripple compensation coil wound around a magnetic shield surrounding the fluxgate detector, or around the secondary coil, the ripple compensation signal being injected into the ripple compensation coil.

In a variant, the ripple compensation signal may be injected into the secondary coil of the measuring head.

In a variant, the ripple compensation signal may be injected into an electrostatic shielding coil of the measuring head wound around the secondary coil.

According to a second aspect of the invention, the microprocessor comprises a controller configured to control an amplitude of the alternating excitation voltage applied across an impedance of the fluxgate detector in order to maintain a preset saturation level in the fluxgate detector. The amplitude control is performed by digital sampling and signal processing of the applied alternating excitation voltage and applying an increase or decrease of the amplitude of the sampled signal.

According to a third aspect of the invention, the alternating excitation voltage is essentially in the form of a sinusoidal wave.

In an advantageous embodiment, the microprocessor comprises a controller configured to control an amplitude of a ripple compensation signal by digital sampling and signal processing of an alternating excitation voltage applied across an impedance of the fluxgate detector and by comparing said applied alternating excitation voltage with preset values stored in a look up table of the electronic circuit.

In an advantageous embodiment, preset values include three values of correspondence for the excitation voltage: at a defined reference temperature, at a defined minimum operating temperature and at a defined maximum operating temperature. Other values between preset values may advantageously be obtained by linear interpolation.

In an advantageous embodiment, the sinusoidal wave is generated by a digital-to-analog converter (DAC) of a microprocessor of the electronic circuit.

In an embodiment, a microprocessor of the electronic circuit comprises a Discrete Fourier Transform (DFT) module configured for digital sampling and signal processing of said applied alternating excitation voltage.

In an embodiment, a microprocessor of the electronic circuit comprises a Goertzel filter configured for digital sampling and signal processing of said applied alternating excitation voltage.

In an embodiment, a number of turns of the secondary coil is at least ten times greater than a number of turns of the ripple compensation coil.

In an embodiment, the electronic circuit comprises a second harmonic detection circuit configured to detect, by digital sampling and signal processing of said applied alternating excitation voltage, a second harmonic of the alternating excitation voltage applied across an impedance of the fluxgate detector, said second harmonic being used to control the secondary coil compensation current in a feedback loop.

In a preferred embodiment, the measuring head has a single said fluxgate detector.

Further objects and advantageous features of the invention will be apparent from the claims, from the detailed description, and annexed drawings, in which:

FIG. 7a is without ripple compensation according to an embodiment of the invention and FIG. 7b without ripple compensation;

FIG. 9a is without ripple compensation according to an embodiment of the invention and FIG. 9b with ripple compensation;

Figure 1A:
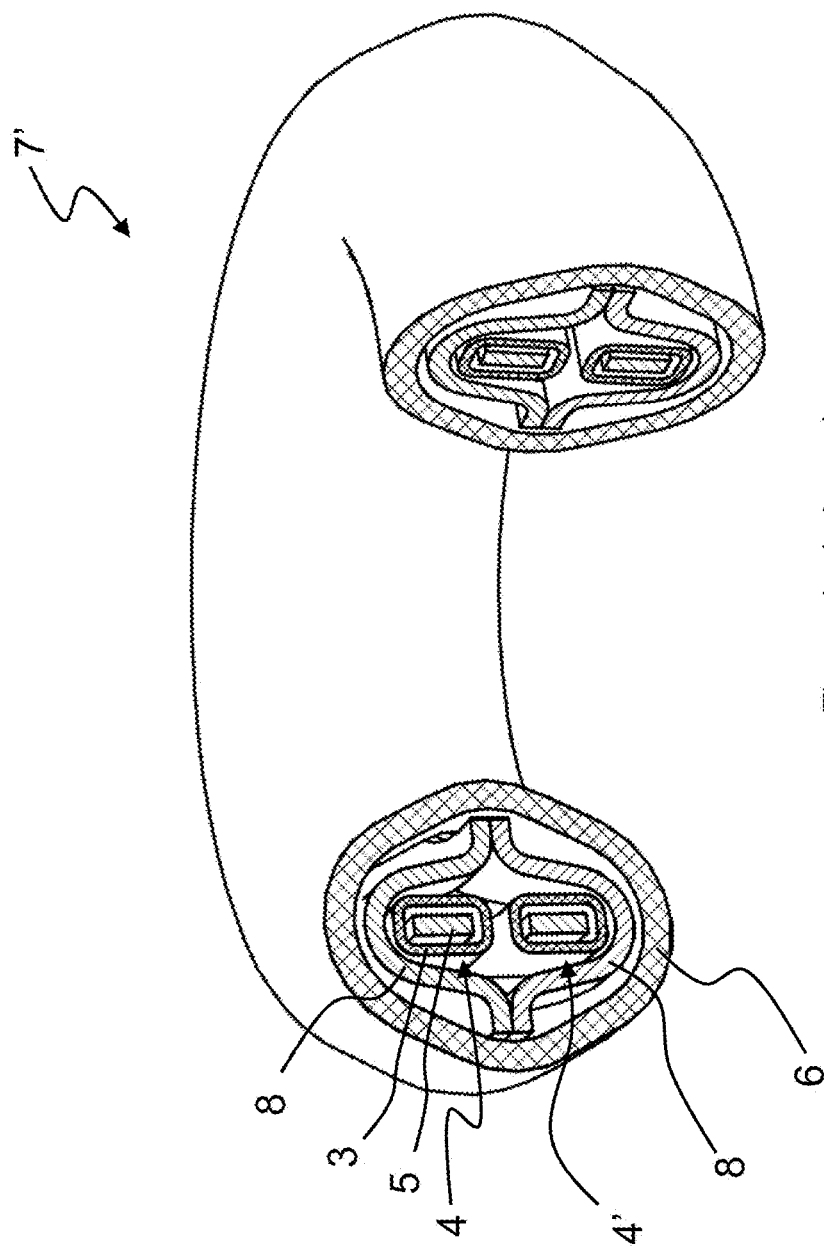
FIG. 1a is a perspective partial cross sectional view of a magnetic measuring head of an electrical current transducer according to the prior art.
Figure 1C:
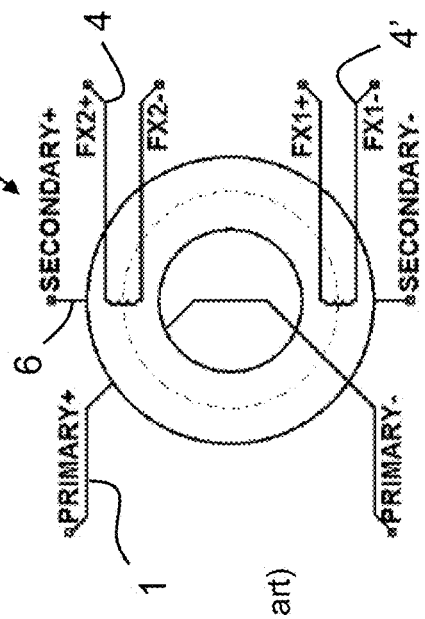
FIG. 1b is a schematic representation of an equivalent circuit of the magnetic measuring head of FIG. 1a and FIG. 1c is a schematic representation of the magnetic measuring head of FIG. 1a according to the prior art.
FIG. 1d is a schematic representation of an equivalent circuit of the magnetic measuring head of FIG. 1a illustrating the cancellation of the ripple effect according to the prior art.
Figure 1B:
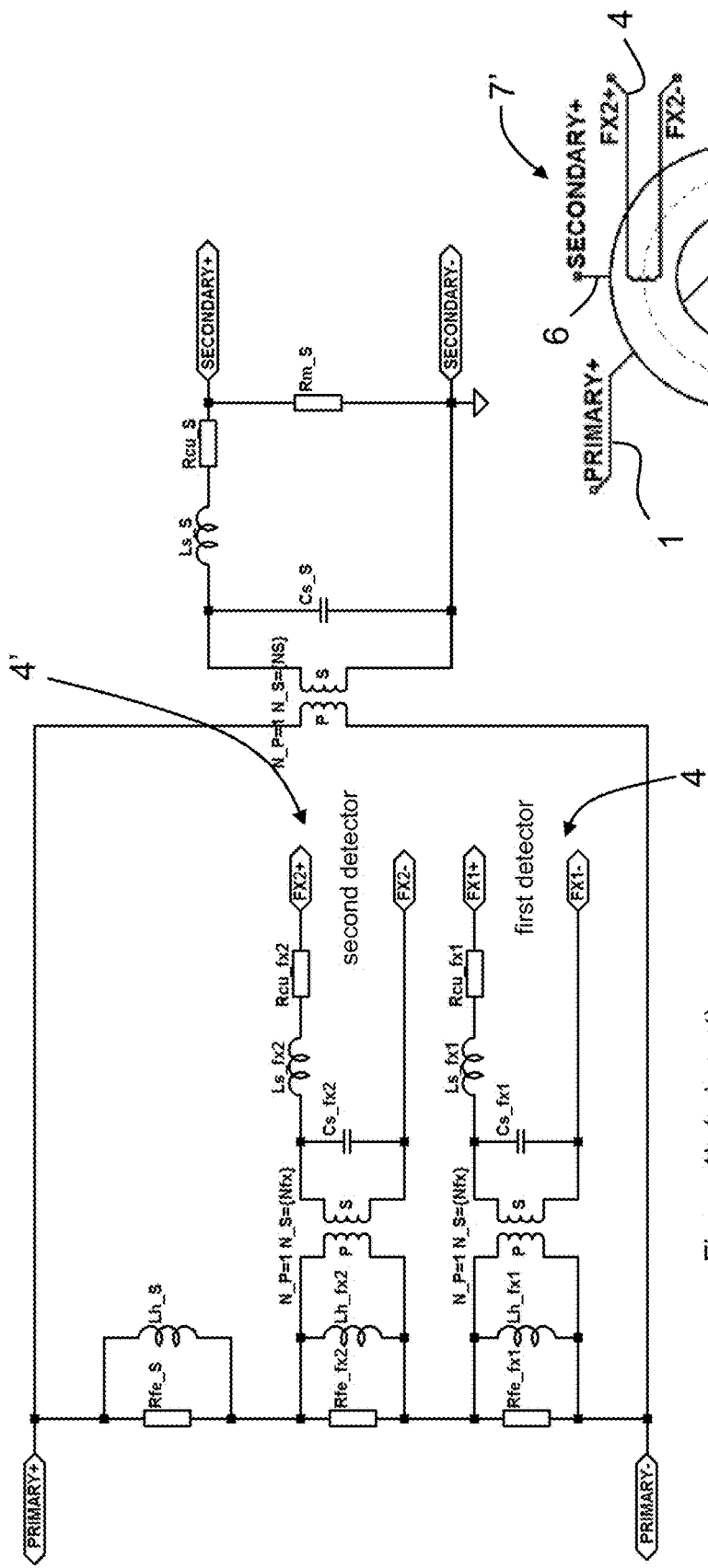
Figure 1D:
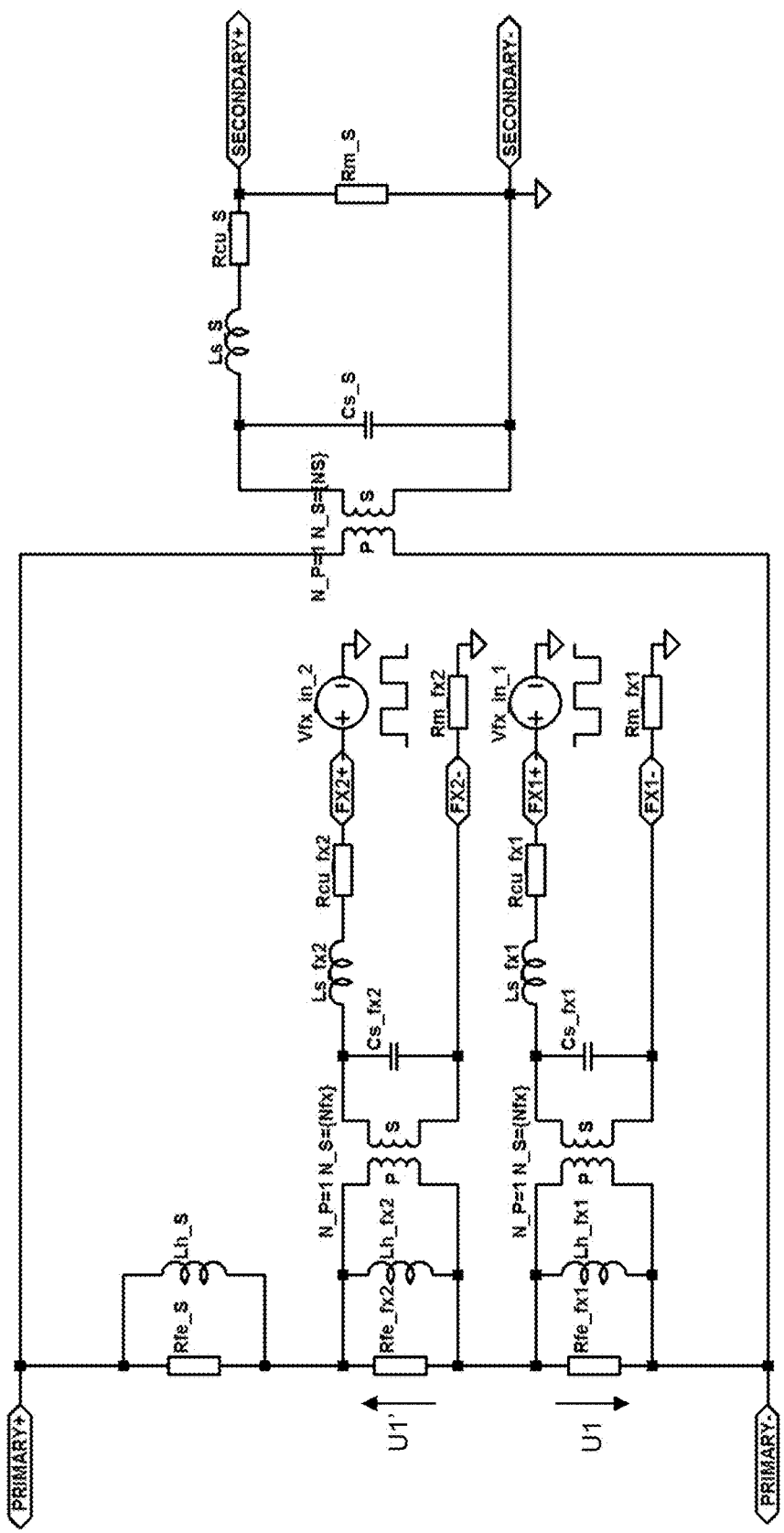
Figure 2:
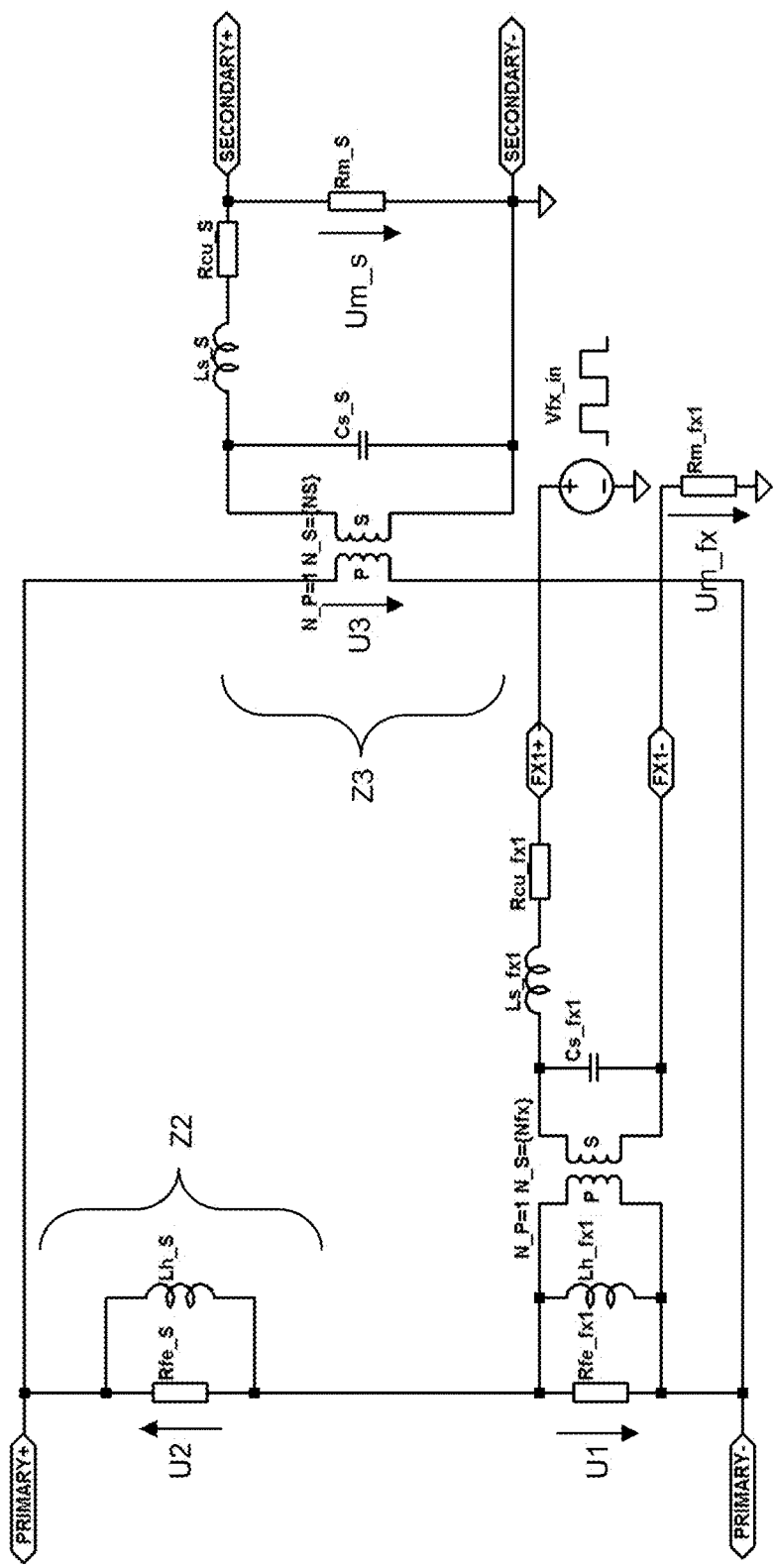
FIG. 2 is a schematic representation of an equivalent circuit of a magnetic measuring head similar to FIG. 1a but with only one fluxgate sensor and no ripple compensation function.
Figure 3B:
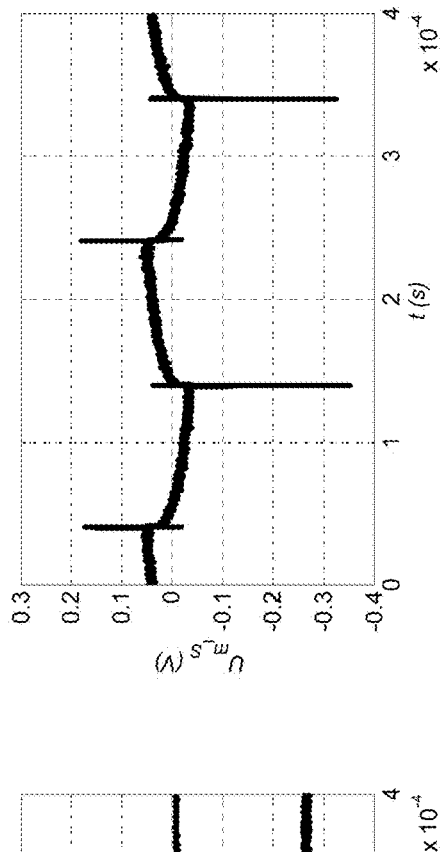
FIGS. 3a, 3b and 3c are graphs illustrating respectively the excitation voltage, the image of the current in a fluxgate winding, and a ripple signal of the output voltage, according to FIG. 2.
Figure 3A:
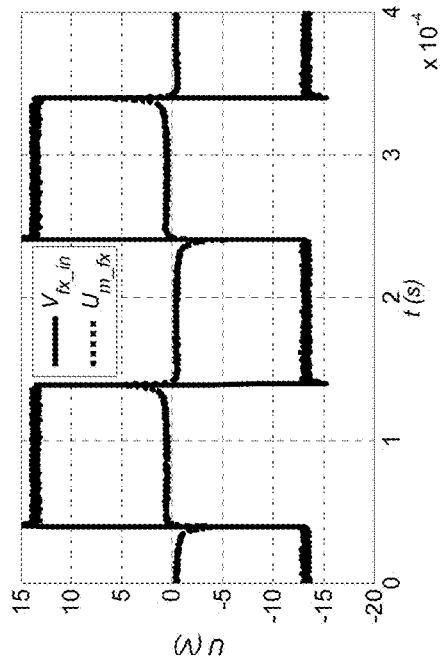
Figure 3C:
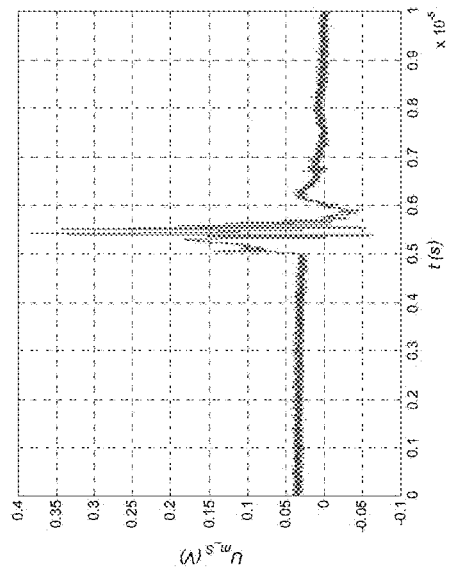
Figure 4:
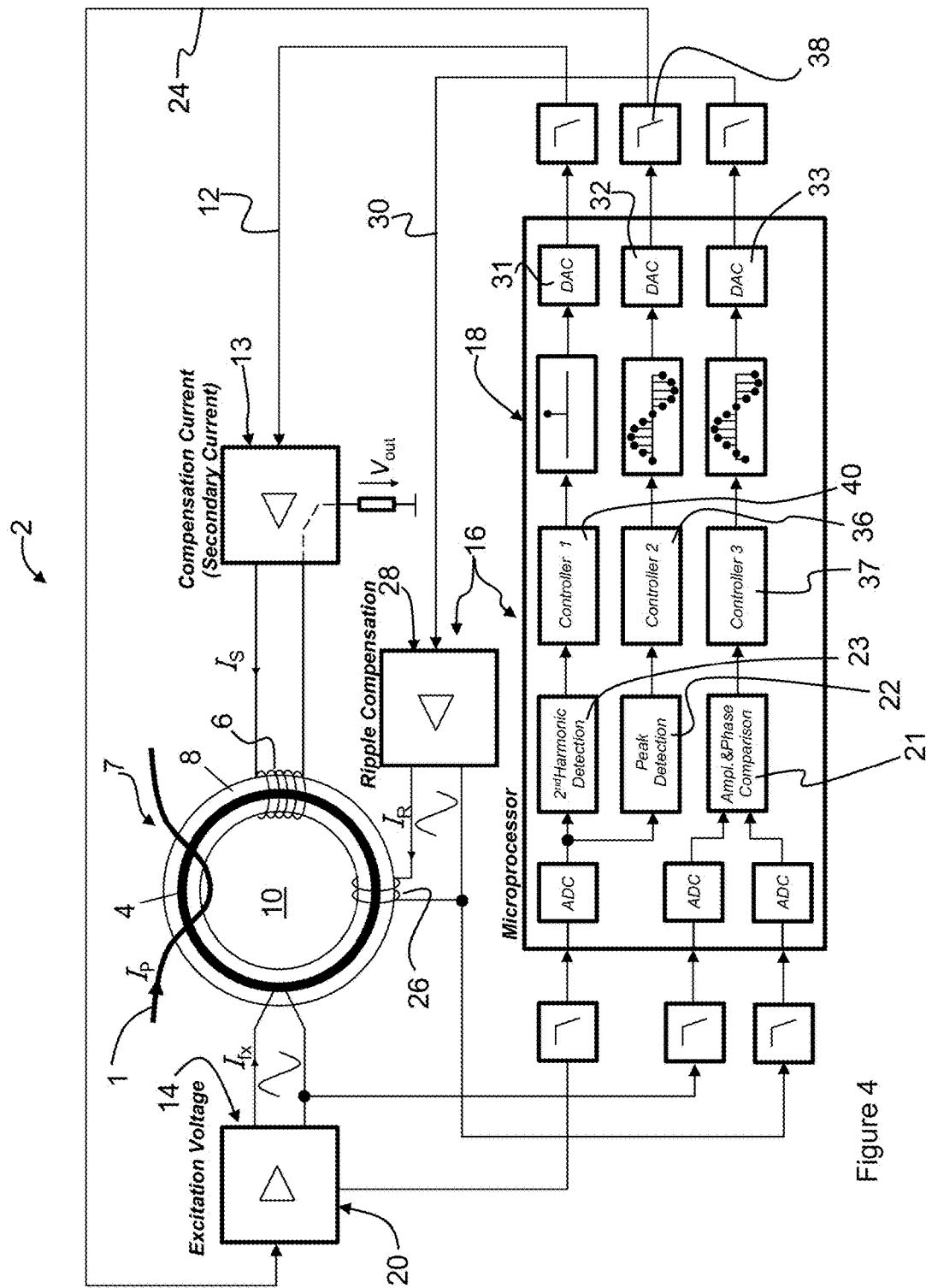
FIG. 4 is a schematic block diagram of an electrical current transducer according to an embodiment of this invention.

Referring to the figures, starting in particular with FIG. 4, an exemplary embodiment of an electrical current transducer 2 for measuring a primary current $I_P$ flowing in a primary conductor 1 comprises a fluxgate measuring head 7 comprising a fluxgate magnetic field detector 4 and a secondary coil 6 wound around the fluxgate magnetic field detector. The fluxgate magnetic field detector shall also be referred to herein as "fluxgate detector" for simplicity. The measuring head may further comprise a magnetic shield 8, made of a soft magnetic material with a high magnetic permeability, surrounding the fluxgate detector 4. The secondary coil 6 may be positioned around the magnetic shield 8. The magnetic shield may for instance be formed of two shell parts assembled together around the fluxgate detector, or of a magnetic material tape wound around the fluxgate detector. The measuring head 7 may, in relation to the above described aspects, have a similar construction to the known measuring head of FIG. 1a, except that the second fluxgate detector 4' is not needed.

As is per se well known in the art, the secondary coil acts as a compensation coil that is supplied with electrical current $I_S$ in a feedback loop 12 connected to the fluxgate detector 4 that seeks to cancel the magnetic field generated by a primary conductor 1 carrying the current $I_P$ to be measured, the primary conductor extending through a central passage 10 of the transducer. The magnetic field generated by the primary conductor 1 circulates in the magnetic shield 8 and a portion thereof is picked up by the fluxgate magnetic field detector 4 positioned inside the shield 8.

The fluxgate magnetic field detector 4 comprises a saturable soft magnetic core 5 surrounded by an excitation coil 3 that is connected to an excitation coil drive circuit 14 that generates an alternating excitation current $I_{fx}$ configured to alternatingly saturate the soft magnetic core. The magnetic field generated by the residual current linkage ($I_P \cdot N_P - I_S \cdot N_S$) generates a bias on the alternating signal $I_{fx}$ that can be measured and that is representative of the measurement error.

In the present invention, the use of a second fluxgate to cancel ripple in the output signal of the principal fluxgate magnetic field detector used for the measurement, is avoided. In the present invention, the ripple compensating function is performed by an electronic circuit 16 comprising a microprocessor 18, that may be the same, or different, as the one used for the control loop 12 to control the secondary winding 6, and a ripple compensation coil control circuit 28 connected to a ripple compensation coil 26 via a control loop 30. The ripple compensation coil control circuit 28 is configured to generate a ripple compensation current $I_R$ that seeks to cancel the ripple signal caused by the excitation current $I_{fx}$ of the fluxgate detector 4. The excitation voltage signal for the excitation coil of the fluxgate magnetic field detector 4 is generated by the microprocessor 18 and an amplifier 20. The peak values of the excitation current $I_{fx}$ are monitored by a peak detection function 22 of the microprocessor 18 and the amplitude of the excitation signal is slowly adapted via a fluxgate control loop 24 in order to achieve essentially constant or stable peak values for the excitation current. This is useful to compensate, inter alia, for the temperature dependent saturation flux of the fluxgate.

Figure 5A:
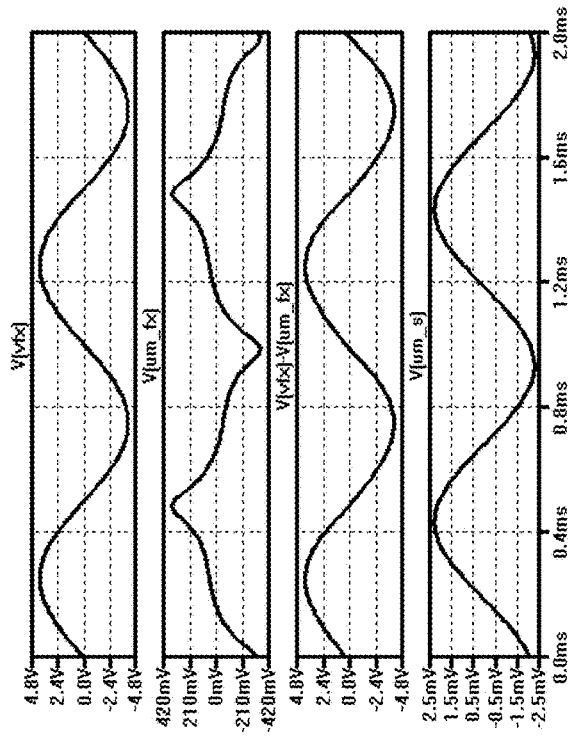
FIG. 5a is a graphical representation of excitation and response signals of a fluxgate detector schematically illustrated in FIG. 5b according to an embodiment of the invention.
Figure 5B:
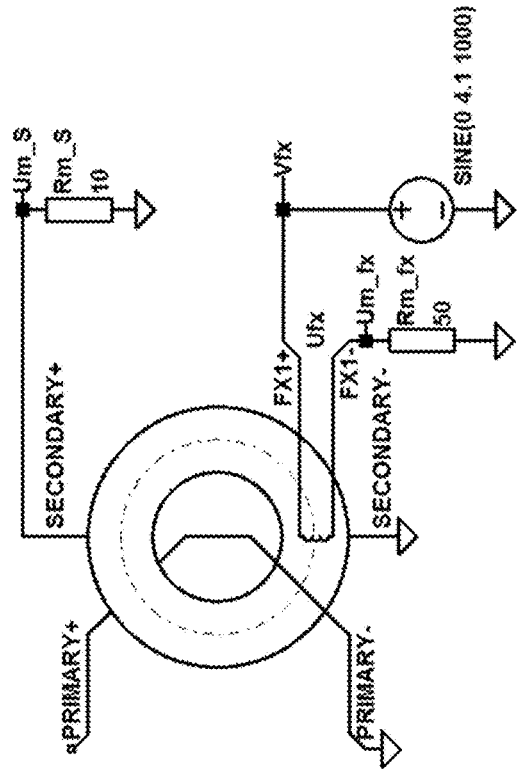

According to a first aspect of the invention, the shape of the excitation signal for the excitation coil of the fluxgate magnetic field detector is provided as a sine wave or an essentially sinosoidal signal. The aim is to have a signal with a low number of harmonics without switching. The simulation of FIGS. 5a, 5b shows different signals when the fluxgate detector is excited with a sinusoidal excitation voltage V1. The voltage signal Um_fx is an image of the current passing through the fluxgate current shunt Rm_fx showing a typical saturation curve of the detector. However the voltage U_fx across the fluxgate detector V1–Um_fx remains close to a perfect sinusoidal wave and thus, due to the coupling effect, the voltage Um_S at the output of the secondary coil remains essentially sinusoidal. Although the peaks have disappeared due to the nature of the excitation voltage V1, a further step is to remove the ripple at the output of the secondary coil. This may be achieved by providing a ripple compensation coil 26 with a plurality of turns Nfxc around the secondary coil and using this ripple compensation coil 26 to inject a current $I_R$ in opposition to the phase of the ripple in order to cancel it. The equivalent circuit comprising the ripple compensation circuit is shown in FIG. 6.

Figure 6:
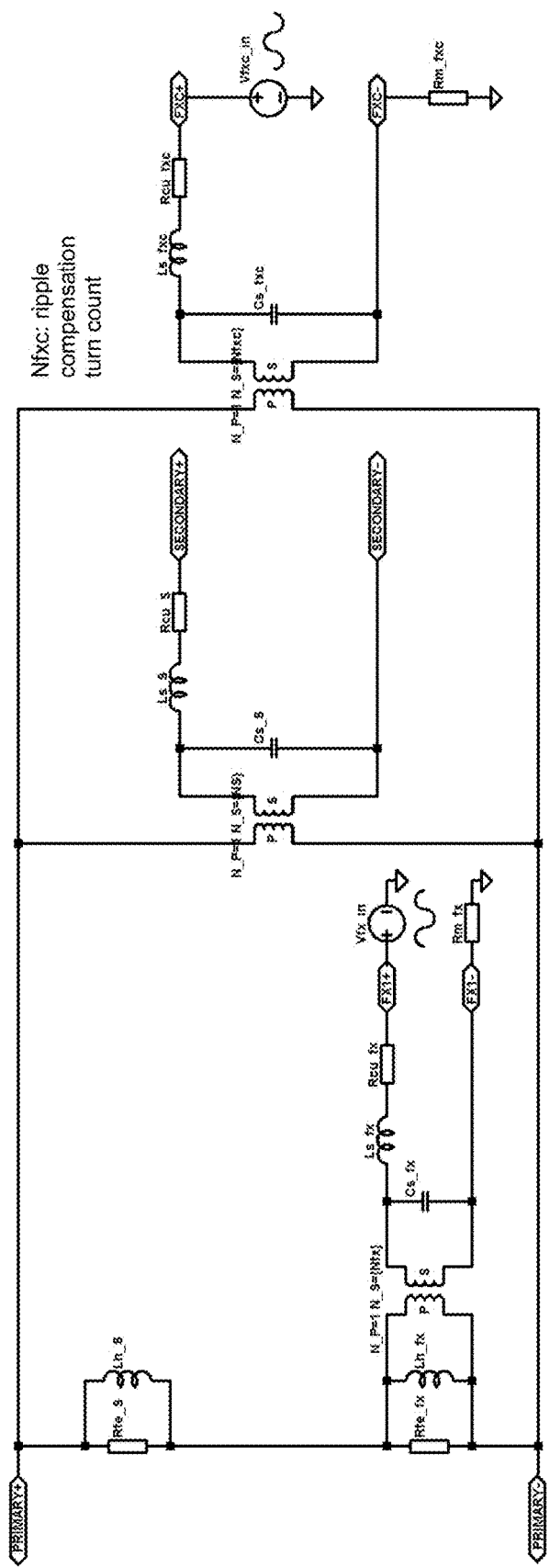
FIG. 6 is a schematic representation of an equivalent circuit of a magnetic measuring head according to an embodiment of the invention.
Figure 7A:
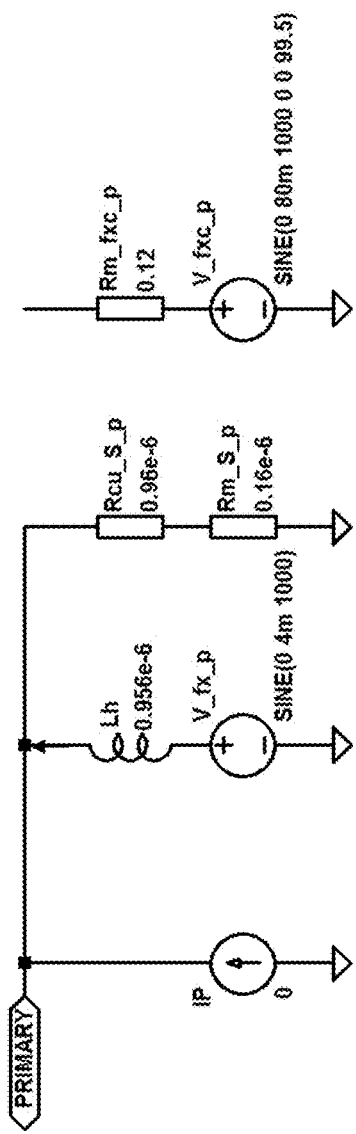
FIGS. 7a and 7b are simplified representations of the circuit of FIG. 6 with an ideal current source, whereby
Figure 7B:
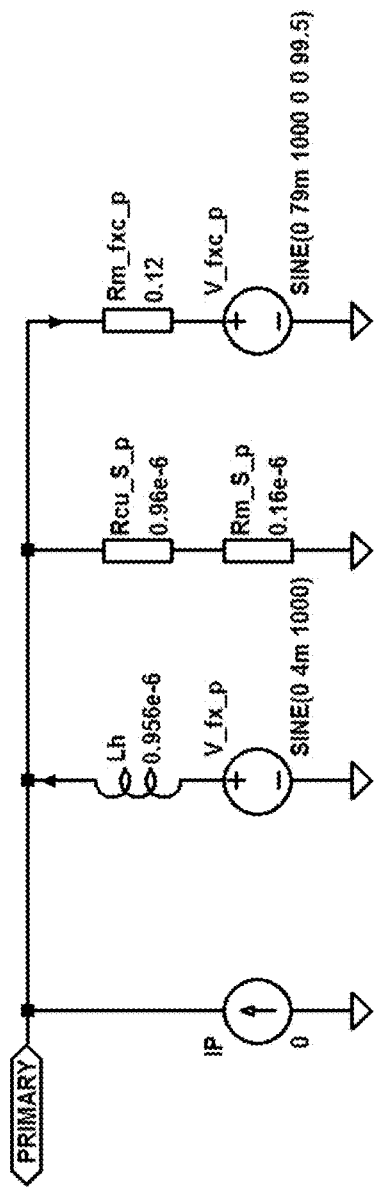

Referring to FIGS. 7a and 7b, simplified circuit diagrams of the equivalent circuit of the FIG. 6 are shown, where FIG. 7a relates to the ripple compensation coil not connected, and FIG. 7b relates to the ripple compensation coil 26 connected, both assuming an ideal current source. In view of the law of transformers, elements such as voltage sources, current sources, inductances and resistances may be referred to the primary side. The mentioned values correspond to an exemplary application. The excitation frequency is chosen as 1 kHz.

Figure 8A:
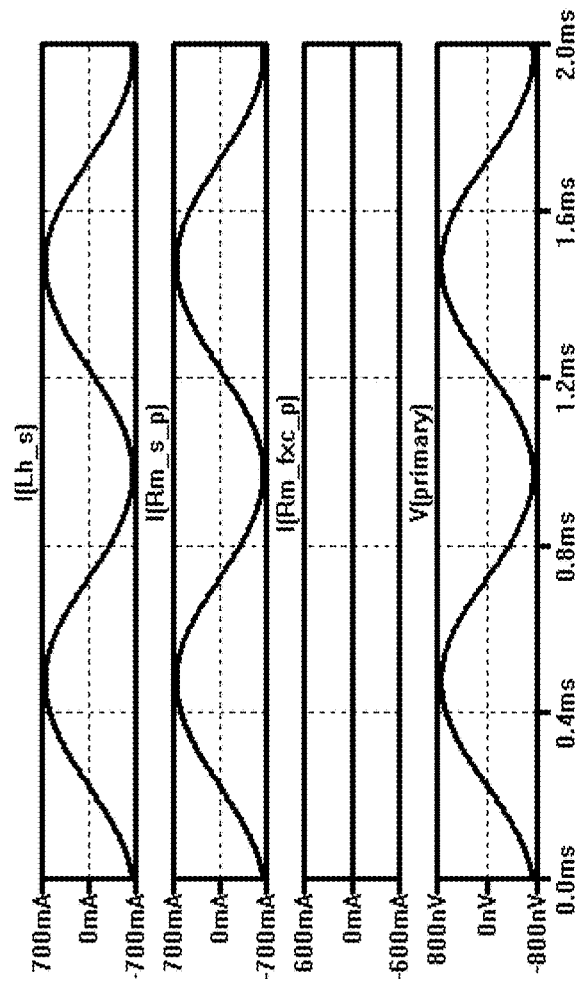
FIG. 8a is a graphical representation of excitation and response signals of the circuit of FIG. 7a and FIG. 8b is a graphical representation of excitation and response signals of the circuit of FIG. 7b.

Referring to FIGS. 7a and 8a, in the situation where the ripple compensation voltage signal source is not connected and the primary current $I_P$ is assumed to be a perfect source when the current is nil, the current coming from the fluxgate excitation voltage referred to primary V_fx_p source has no choice but to pass through the secondary coil load Rcu_S_p+Rm_S_p and a ripple is thus coupled to the secondary side circuit.

Figure 8B:
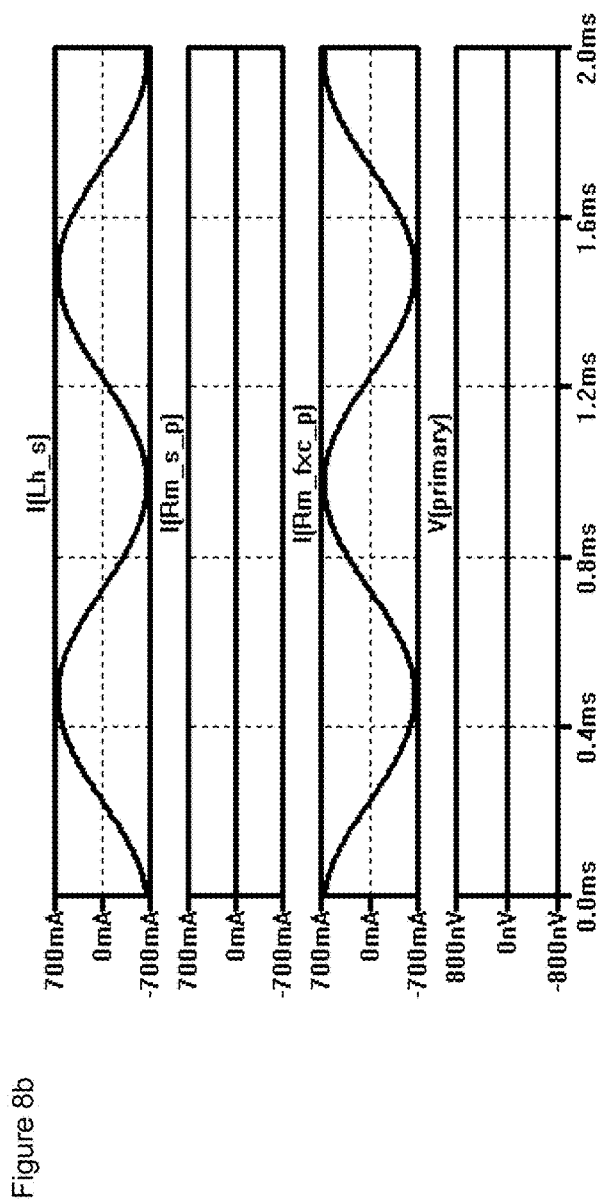
Figure 9A:
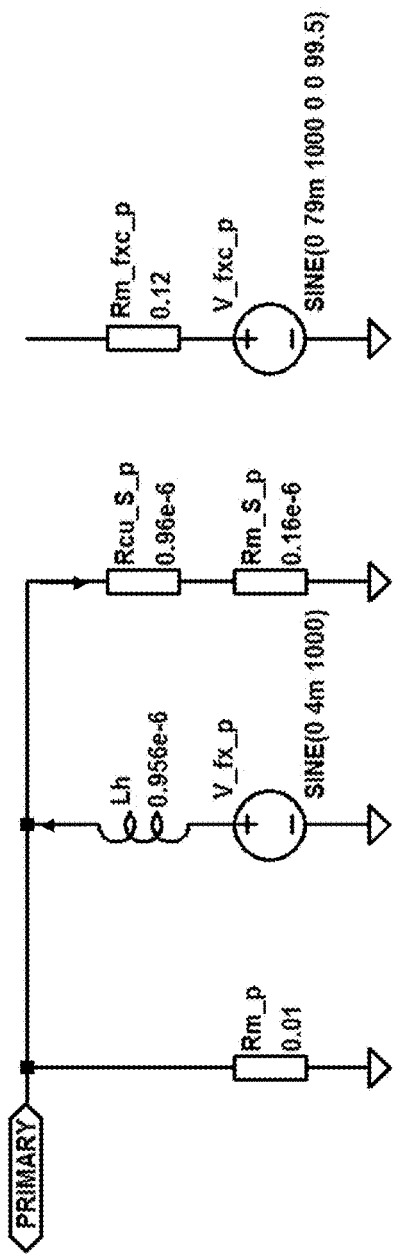
FIGS. 9a and 9b are simplified representations of the circuit of FIG. 6 with a non-ideal current source, whereby
Figure 10A:
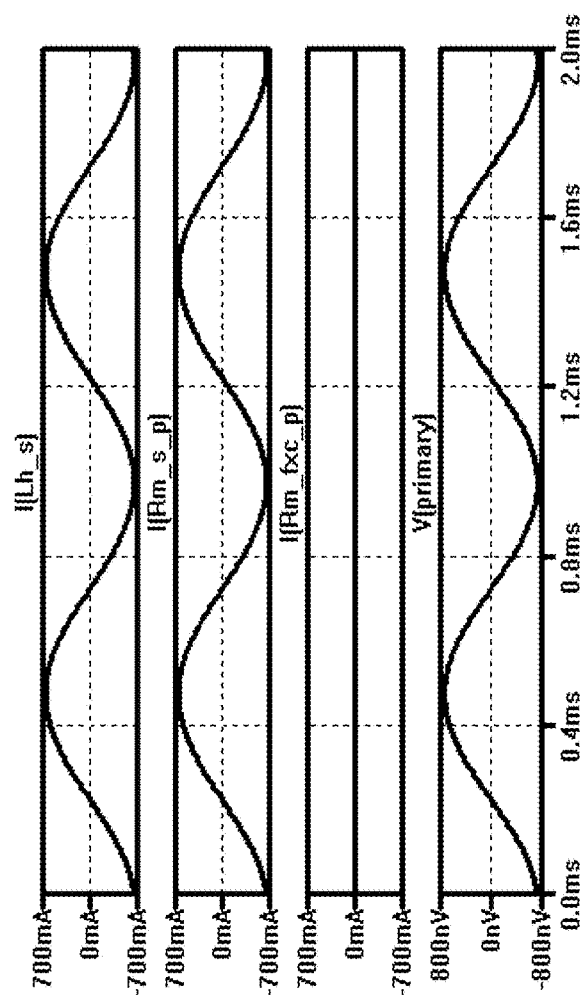
FIG. 10a is a graphical representation of excitation and response signals of the circuit of FIG. 9a and FIG. 10b is a graphical representation of excitation and response signals of the circuit of FIG. 9b.
Figure 9B:
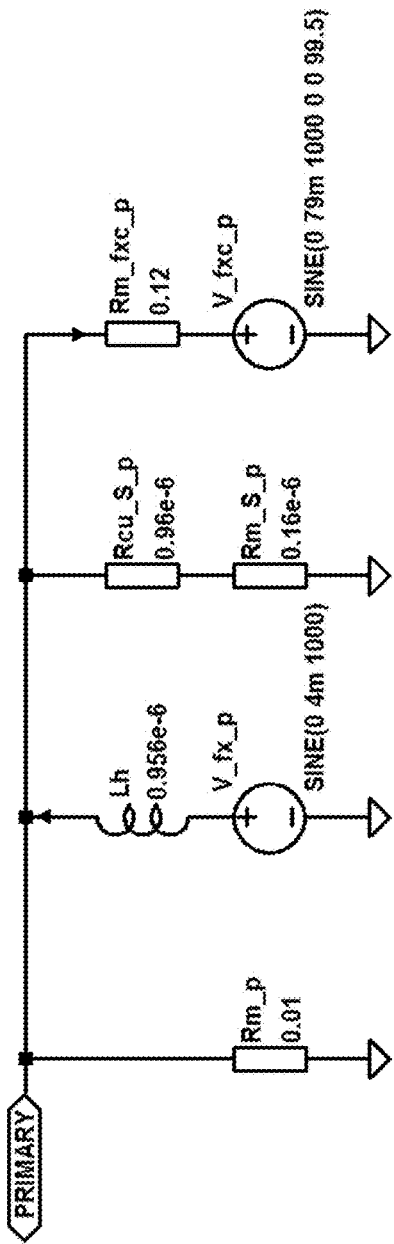
Figure 10B:
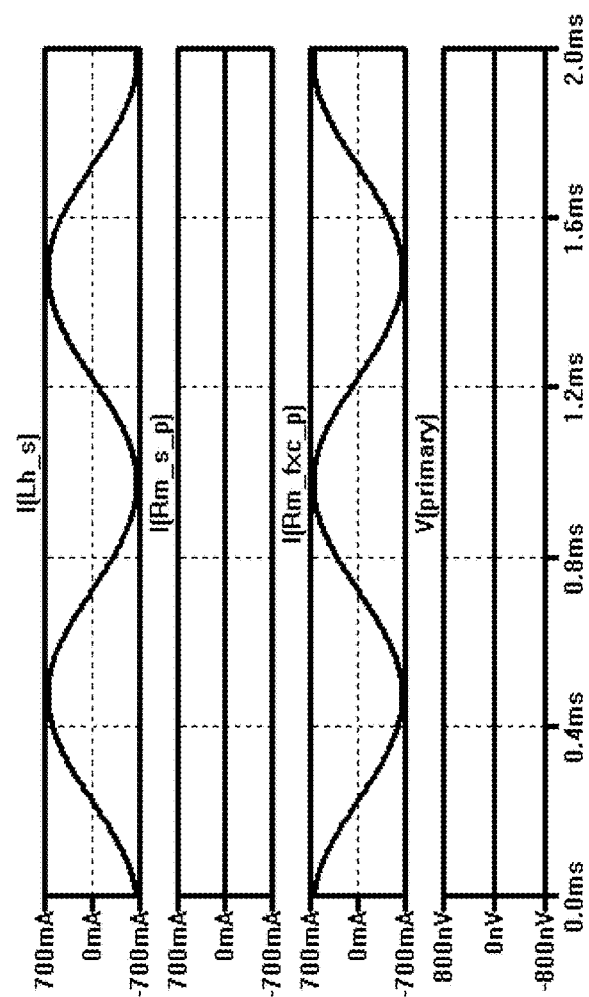

Referring to FIGS. 7b and 8b, cancellation of the ripple effect when the ripple compensation voltage referred to primary V_fxc_p source is connected is illustrated. By appropriately setting the phase and the amplitude of the compensation coil voltage signal V_fxc_p, the current coming from the fluxgate excitation voltage signal V_fx_p source is deflected and absorbed by compensation coil voltage signal V_fxc_p source. Since the voltage across the secondary load is near zero, there is no ripple coupled to the secondary circuit.

Referring to FIGS. 9a, 10a and 9b, 10b, even in case of a non-ideal primary current source, represented by the primary current source impedance Rm_p the ripple compensation is still effective in reducing the ripple effect. Due to a large number of turns of the secondary coil circuit, for instance N_S=2500 and Nfxc=50, the secondary side impedance Rm_S_p is very low in comparison to the primary impedance. Thus the setting of the compensation coil voltage signal V_fxc_p is virtually not dependent on the primary current source impedance Rm_p or secondary side impedance Rm_S. Even when the transducer functions as a current transformer in transformer effect mode, the current from the primary conductor will not be coupled with the ripple compensation circuit 26, 28 but with the secondary circuit 6, 13, provided that the number of secondary coil turns N_S is much larger than the number of turns Nfxc of the ripple compensation coil: N_S>>Nfxc. Preferably, the number of secondary coil turns N_S is at least ten times greater than the number of turns Nfxc of the ripple compensation coil.

Figure 11:
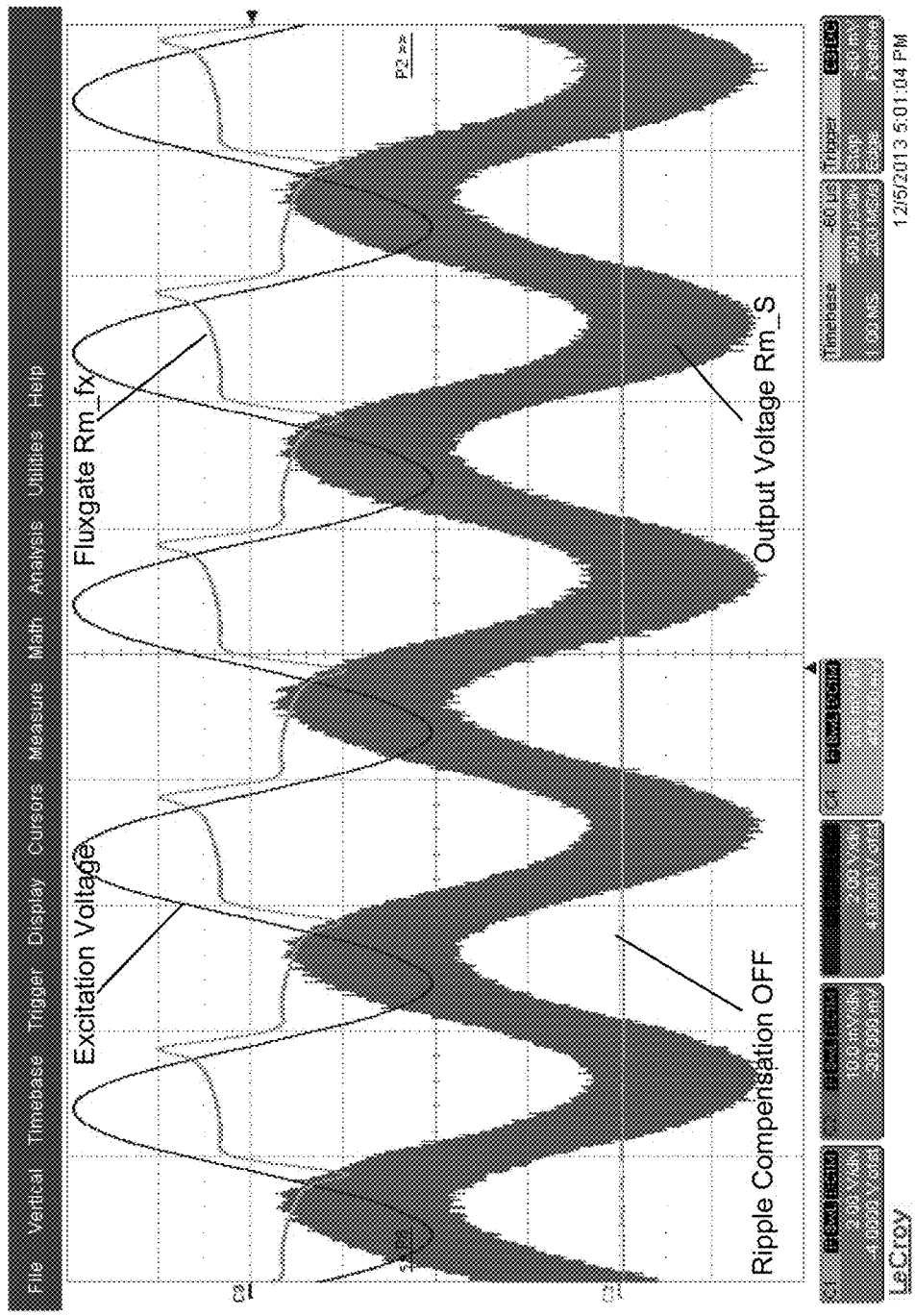
FIG. 11 is a graphical representation of excitation and output signals of a circuit without ripple compensation.
Figure 12:
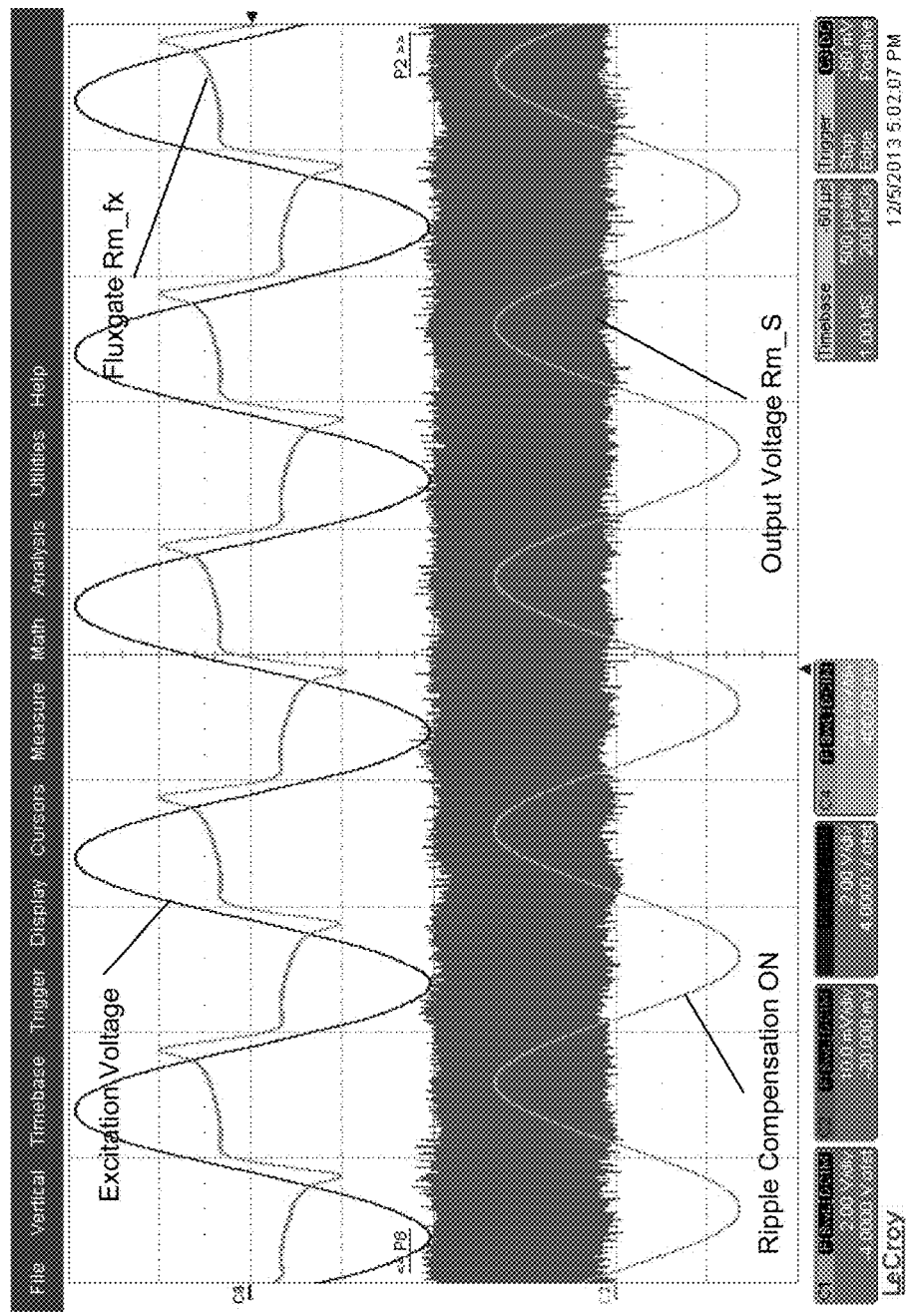
FIG. 12 is a graphical representation of excitation and output signals of a circuit with ripple compensation according to an embodiment of the invention.

Referring to FIG. 11 the measurement of the secondary circuit output voltage when the ripple compensation circuit is switched off is illustrated. The high frequency (HF) noise that is found in the secondary circuit output voltage signal is due to the nature of the power amplifier which in this example is a class D amplifier with for instance a switching frequency of 200 kHz. Once the ripple compensation coil is switched on, as shown in FIG. 12, the ripple disappears, whereby the remaining signal is due to the HF noise of the class D amplifier.

Figure 13:
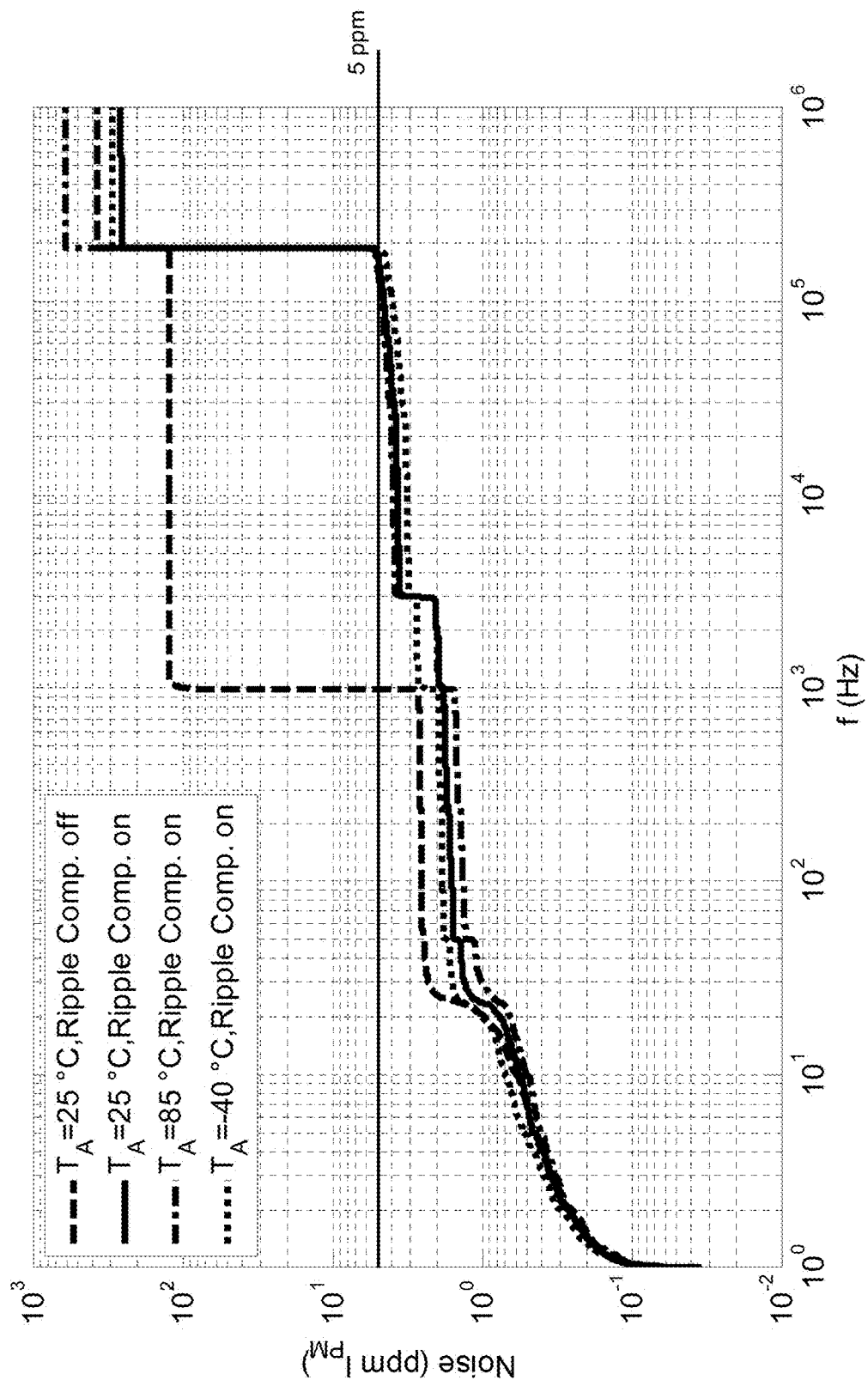
FIG. 13 is a graphical representation of the integrated residual noise (error signal) with and without ripple compensation over frequency for different operating temperatures.

FIG. 13 shows the integral of the noise spectral density over frequency versus frequency of a current transducer for a primary measuring range of $I_{PM}$=3000 A with the above mentioned characteristics described in relation to FIGS. 9-10. Without compensation, the error due to the ripple represents a value greater than 100 ppm (parts per million). With the ripple compensation circuit switched on, the error value is around 5 ppm. The coherent noise (ripple) of the fluxgate detector excitation frequency at 1 kHz is well compensated. Due to the small distortion of the voltage Ufx across the fluxgate detector (as discussed earlier in relation to FIGS. 5a, 5b) the 3rd harmonic at 3 kHz is present (but could be suppressed by adding a signal of this frequency with appropriate amplitude and phase to the compensation signal).

The excitation voltage of the fluxgate detector is a sine wave which is initially generated by a digital to analog converter (DAC) 32 of a microprocessor 18 of the current transducer. Once filtered and amplified, for instance via a push-pull output circuit, the sine wave signal is applied to the excitation coil of the fluxgate detector 4 through a capacitor in order to eliminate a possible DC (direct current) offset component which could be interpreted as a primary current by the detector. The voltage across the fluxgate current shunt Rm_fx, which is the image of the current passing through the fluxgate detector, is sampled.

When the residual current linkage is nil, the sampled signal comprises essentially only odd harmonics. On the other hand, with a residual current linkage different from zero, even harmonics appear. As the second harmonic is the largest, measurement of the residual current linkage is performed by extracting principally the second harmonic, for instance by using a Discrete Fourier Transform (DFT) for a specific frequency, i.e. two times the excitation frequency.

In a variant, a Goertzel filter or any other method to extract the second harmonic or even harmonics of higher order may be used for the digital signal processing.

Figure 14A:
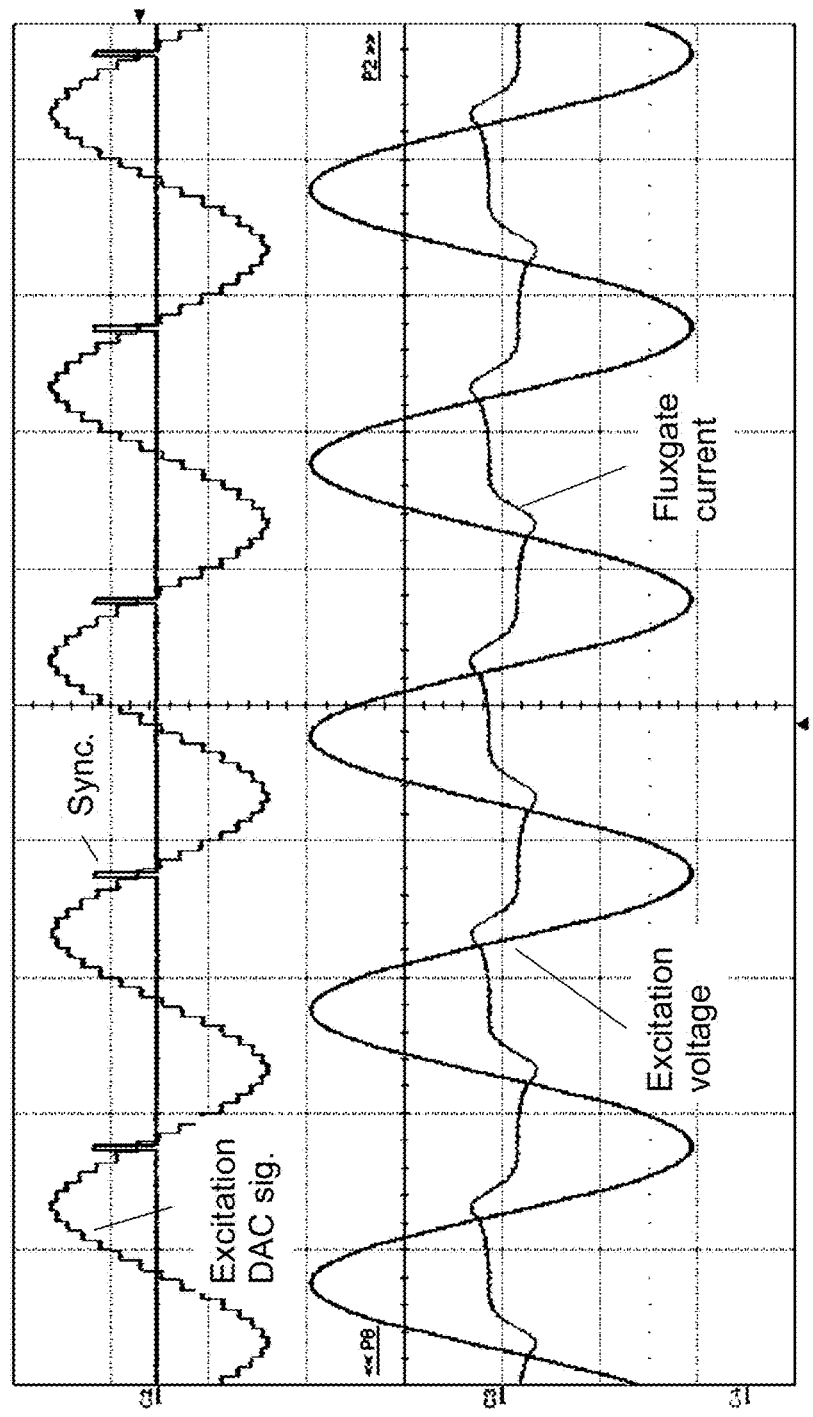
FIGS. 14a and 14b are graphical representations of excitation and fluxgate response signals of a fluxgate detector according to an embodiment of the invention, FIG. 14a representing the behavior when the primary current is zero and FIG. 14b representing the behavior when the primary current is non-zero (in the specific case 1 ampere direct current)
Figure 14B:
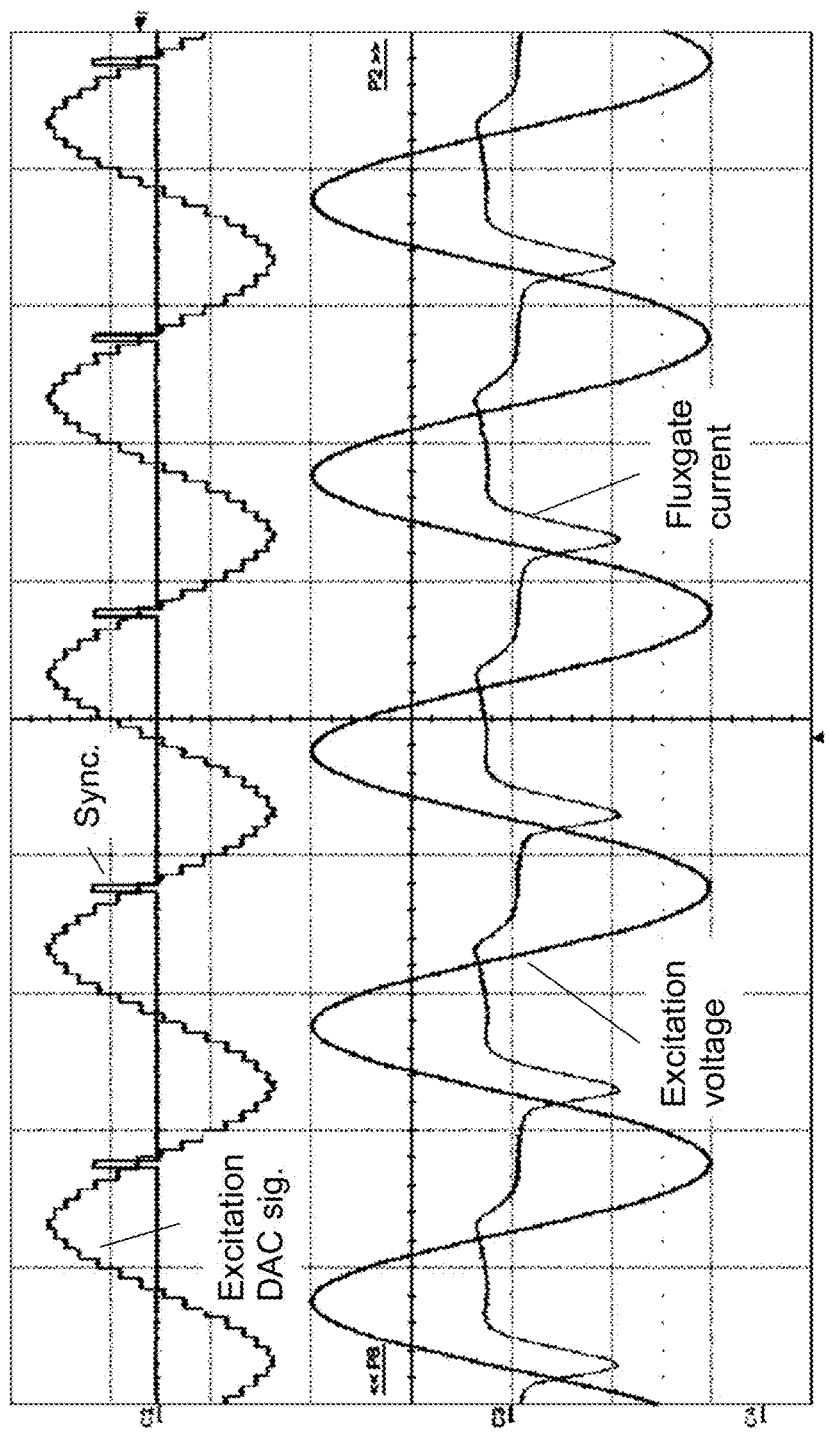

FIGS. 14a and 14b show the measurement of the excitation voltage and the current of the fluxgate detector through the fluxgate current shunt resistor Rm_fx. In FIG. 14a the primary current is nil, whereby one observes that the fluxgate current is symmetrical and that there are no even harmonics. In FIG. 14b the primary current is different from zero, in this specific example 1 ampere, whereby the signal is asymmetrical and even harmonics are present. This detection is used in a closed loop system, in other words it is used to control the secondary current to compensate the primary conductor signal (also known as the primary conductor current linkage or primary ampere-turns).

The sampled values of the fluxgate current signal are also processed to control the saturation level of the fluxgate detector, on the one hand to avoid excessive saturation which would increase the energy consumption and the distortion of the ripple, which is then harder to cancel, and on the other hand to avoid a low saturation which doesn't allow to perform second harmonic detection.

Figure 15B:
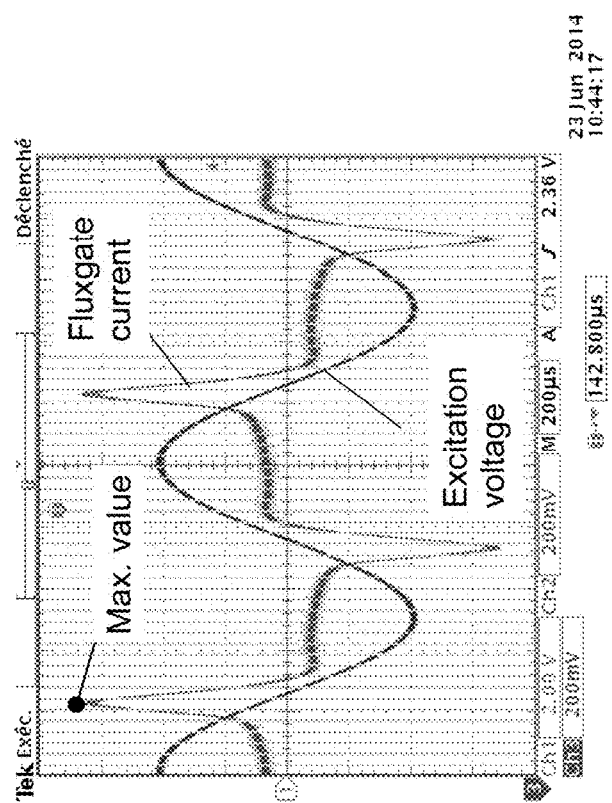
FIGS. 15a and 15b illustrate a voltage behavior of a fluxgate detector according to an embodiment of the invention for different excitation voltages, FIG. 15a representing an excitation voltage peak of 4.0V and FIG. 15b an excitation voltage peak of 4.1V.
Figure 15A:
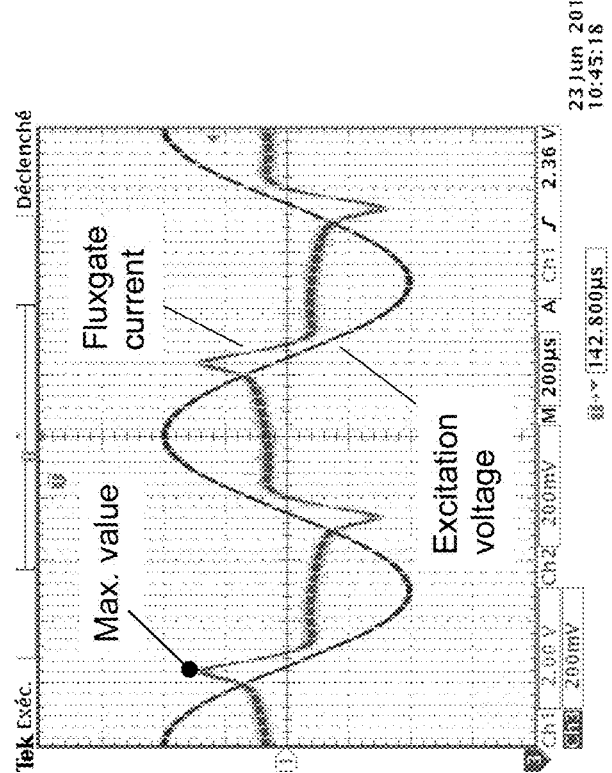

The maximum (peak) value of the voltage across the fluxgate shunt resistor Rm_fx provides information about the saturation level. Referring to FIG. 4, a schema of a control circuit (blocks 22, 36, 32) for controlling the saturation level of the fluxgate detector is illustrated. After comparing the maximum value with a chosen setpoint value, the second controller 36, which may for instance comprise a pure integrator, increases or decreases (as required) the amplitude of the excitation DAC signal fed into low pass filter 38. The excitation voltage is set to maintain a certain saturation level defined in the microprocessor, which is useful to adjust for scattering between fluxgate detectors in production and variation of the characteristics of the fluxgate detector versus temperature during use. FIGS. 15a and 15b illustrate the fluxgate detector voltage behavior for different excitation voltages, FIG. 15a representing an excitation voltage peak of 4.0V and FIG. 15b an excitation voltage peak of 4.1V.

Referring to FIG. 4, the first controller 40 generates a signal controlling amplifier 13 to compensate the primary current linkage with the secondary current $I_S$.

Figure 16:
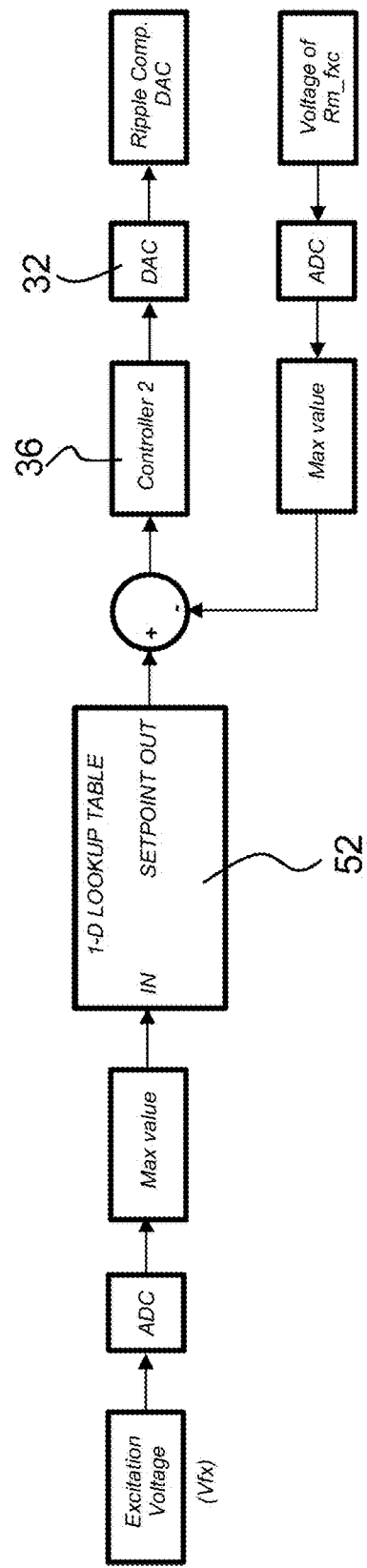
FIG. 16 is a block schema of an example of a controller circuit for the ripple compensation coil circuit according to an embodiment of the invention.

The third controller 37 of the microprocessor 18 (see FIG. 4) concerns the ripple compensation (see principle in FIG. 6). To keep a certain level of accuracy (see FIG. 13), a small correction is applied. The ripple amplitude is linked to the excitation voltage and as the excitation voltage changes as a function of temperature, the ripple compensation is also sensitive to the temperature. Thus at each excitation voltage value there is an optimal value (phase and amplitude) of the compensation voltage signal Vfxc. The phase may be set once but the amplitude may be controlled through a lookup table (LUT) 52 illustrated in FIG. 16, or any other appropriate control algorithm as a function of the fluxgate excitation voltage. After excitation voltage sampling, thanks to the lookup table LUT 52, a setpoint is assigned to the input value IN. The LUT 52 includes mainly three values of correspondence: one for the excitation voltage, for instance at a defined reference temperature Ta=25° C., another one for a defined minimum operating temperature Ta min and another one for a defined maximum operating temperature Ta max. For the other cases linear interpolation may be applied. Temperature dependence of the saturation flux density may thus be automatically included in the compensation: at higher temperatures, saturation flux decreases, due to the control loop for the excitation voltage, this voltage decreases as well and with it also the excitation compensation signal. The sampling of the voltage across the ripple compensation coil load Rm_fxc allows to control by means of the second controller 36, which may comprise a pure integrator, the amplitude of the Ripple compensation DAC 33.

Figure 17:
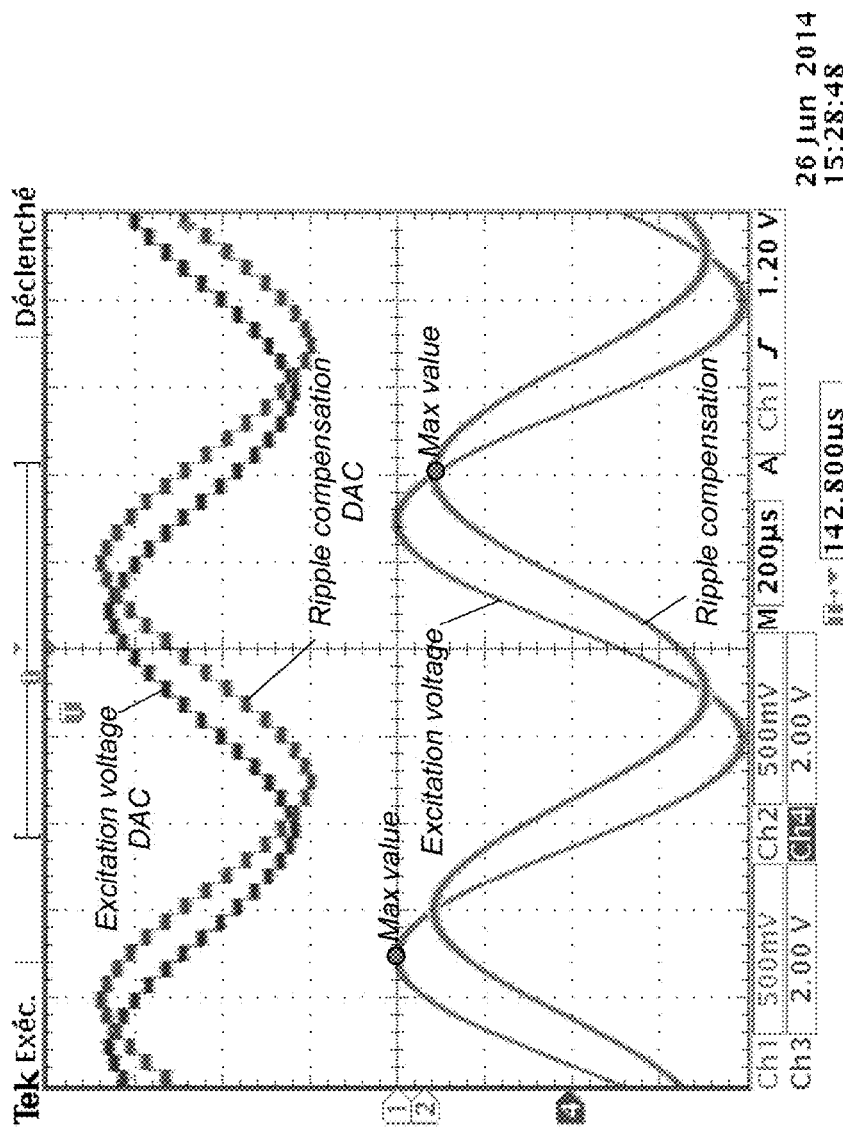
FIG. 17 is a graphical representation of excitation and ripple compensation signals of a fluxgate detector according to an embodiment of the invention.

FIG. 17 shows the excitation DAC output signal and the ripple compensation DAC output signal before and after a low-pass filter 38.

In a variant of the invention, instead of providing a dedicated ripple compensation coil 26, the secondary coil 6 could be used to inject the compensation voltage by adding the compensation signal to the input signal of the secondary current control circuit amplifier 13 either in the digital or analog domain. In effect, if the fluxgate detector is excited by a voltage signal, the compensation signal should also be a voltage.

In another variant of the invention, instead of providing a dedicated ripple compensation coil 26, an electrostatic shielding screen made of a conductor wound around the secondary coil winding can be used to inject the compensation voltage. This is also possible in many conventional transducer head designs because electrostatic screens for windings of toroidal transformers are often made of an insulated copper strip wound after the last winding.

Amplitude and phase of the excitation compensation signal may be determined during commissioning of a current transducer, but they could (even for several harmonics) also be minimized by an on-line algorithm during normal operation of the transducer.

The invention claimed is:

1. Electrical current transducer of a closed-loop type for measuring a primary current (IP) flowing in a primary conductor, comprising a fluxgate measuring head and an electronic circuit (16) including a microprocessor for digital signal processing, the measuring head including a secondary coil, a fluxgate detector comprising an excitation coil and a magnetic material core, and optionally a magnetic shield surrounding the fluxgate detector, the electronic circuit comprising an excitation coil drive configured to generate an alternating excitation voltage to supply the excitation coil with an alternating excitation current (Ifx), secondary coil connected in a feedback loop of the electronic circuit to the excitation coil drive circuit, characterized in that the electronic circuit further comprises a ripple compensation circuit configured to compensate for a ripple signal generated by the alternating excitation voltage by injecting a ripple compensation signal into a coil of the measuring head.

2. Current transducer according to claim 1, wherein the measuring head comprises a dedicated ripple compensation coil wound around the secondary coil or around the magnetic shield, the ripple compensation signal being injected into the ripple compensation coil.

3. Current transducer according to claim 2, wherein a number of turns (N_S) of the secondary coil is at least ten times greater than a number of turns (Nfxc) of the ripple compensation coil.

4. Current transducer according to claim 1, wherein the ripple compensation signal is injected into the secondary coil of the measuring head.

5. Current transducer according to claim 1, wherein the ripple compensation signal is injected into a shielding coil of the measuring head.

6. Current transducer according to claim 1, wherein the alternating excitation voltage is essentially in the form of a sinusoidal wave.

7. Current transducer according to claim 1, wherein the electronic circuit comprises a controller configured to control an amplitude of the alternating excitation voltage applied across an impedance (Rm_fx) of the fluxgate detector in order to maintain a present saturation level in the fluxgate detector, said amplitude control comprising digital sampling and signal processing of said applied alternating excitation voltage and applying an increase or decrease of an amplitude of the sampled signal.

8. Current transducer according to claim 1, wherein the electronic circuit comprises a controller configured to control an amplitude of the ripple compensation signal (Vfxc) by digital sampling and signal processing of an alternating excitation voltage applied across an impedance (Rm_fx) of the fluxgate detector and by comparing said applied alternating excitation voltage with present values stored in a look up table of the electronic circuit.

9. Current transducer according to claim 1, wherein the alternating excitation voltage is generated by a digital-to-analog converter (DAC) of a microprocessor of the electronic circuit.

10. Current transducer according to claim 1, wherein the electronic circuit comprises a Discrete Fourier Transform (DFT) module configured for digital sampling and signal processing of said applied alternating excitation voltage.

11. Current transducer according to claim 1, wherein the electronic circuit comprises a Goertzel filter configured for digital sampling and signal processing of said applied alternating excitation voltage.

12. Current transducer according to claim 1, wherein the electronic circuit comprises a second harmonic detection circuit configured to detect, by digital sampling and signal processing of said applied alternating excitation voltage, a second harmonic of the alternating excitation voltage applied across an impedance (Rm_fx) of the fluxgate detector, said second harmonic being used to control the secondary coil compensation current in a feedback loop.

13. Current transducer according to claim 1, wherein the measuring head has a single said fluxgate detector.

14. Electrical current transducer of a closed-loop type for measuring a primary current (IP) flowing in a primary conductor, comprising a fluxgate measuring head and an electronic circuit (16) including a microprocessor for digital signal processing, the measuring head including a secondary coil, a fluxgate detector comprising an excitation coil and a magnetic material core, and optionally a magnetic shield surrounding the fluxgate detector, the electronic circuit comprising an excitation coil drive circuit configured to generate an alternating excitation voltage to supply the excitation coil with an alternating excitation current (Ifx), the secondary coil connected in a feedback loop of the electronic circuit to the excitation coil drive circuit, wherein the electronic circuit further comprises a ripple compensation circuit configured to compensate for a ripple signal generated by the alternating excitation voltage by injecting a ripple compensation signal into a coil of the measuring head the electronic circuit comprises a controller configured to control an amplitude of the ripple compensation signal (Vfxc) by digital sampling and signal processing of an alternating excitation voltage applied across an impedance (Rm_fx) of the fluxgate detector and by comparing said applied alternating excitation voltage with preset values stored in a look up table of the electronic circuit and wherein said preset values include three values of correspondence for the excitation voltage: at a defined reference temperature (Ta), at a defined minimum operating temperature (Ta min) and at a defined maximum operating temperature (Ta max).

* * * * *